SYNCHRONIZED OSCILLATOR FOR FM LIMITER AND DISCRIMINATOR

Filed Jan. 7, 1949 3 Sheets-Sheet 1

INVENTOR.
REX E. LOVEJOY
BY M. A. Hayes

Inventor
REX E. LOVEJOY

By M. A. Hayes
Attorney

Feb. 28, 1961 R. E. LOVEJOY 2,973,482
SYNCHRONIZED OSCILLATOR FOR FM LIMITER AND DISCRIMINATOR
Filed Jan. 7, 1949 3 Sheets-Sheet 3

INVENTOR.
REX E. LOVEJOY
BY M. O. Hayes 2,973,482

SYNCHRONIZED OSCILLATOR FOR FM LIMITER AND DISCRIMINATOR

Rex E. Lovejoy, 525 40th St., Richmond, Calif.

Filed Jan. 7, 1949, Ser. No. 69,766

2 Claims. (Cl. 329—123)

(Granted under Title 35, U.S. Code (1952), sec. 266)

The present invention relates to detection of frequency modulation and more particularly to a simplified, combined limiter and discriminator circuit.

Heretofore frequency discriminators for reception of signals on frequency modulated radio waves have made use of selective circuits tuned slightly off resonance with the mean frequency of the carrier waves, and of pairs of selective circuits so tuned that one is above and the other below resonance with the mean frequency.

It is well known that these discriminators have the disadvantage of responding to amplitude modulation if such is present along with the frequency modulation unless preceded by a limiter, and that their response characteristics are not linear so that they introduce distortion. Attempts to make these characteristics linear lead to bandwidth difficulties. Limiting circuits in turn have a tendency to introduce additional distortions of various kinds.

An object of the present invention is to incorporate in a single-tube circuit the combined function of limiter discriminator and amplifier.

Another object is to provide a single-tube circuit with these functions which will have a more linear overall discriminating characteristic and consequently introduce less distortion.

A further object is to provide a circuit of the above type which will have a greater range of discrimination action than hitherto attained.

A further object is to provide a circuit of the above type which will be sensitive to a very small frequency modulated voltage.

The invention makes use of the tendency of an oscillator to pull into synchronism with a variable frequency signal of given frequency range when such signal is injected at a suitable point in the circuit. The oscillator will under this condition have a nearly linear characteristic of output voltage versus frequency of the injected signal. It has been discovered that this characteristic of the oscillator can be made substantially linear by the insertion of a phase-shifting or attenuating network of predetermined constants in the oscillator circuit and that this principle may be applied to any conventional oscillator. Hereinafter when reference is made to the oscillator characteristic it will be this oscillator output characteristic of voltage versus frequency that is meant.

The phase shifting network may be placed in the grid or plate or feedback circuit of the oscillator depending upon the particular type of oscillator and the function it is required to perform. The oscillator output voltage varies at a rate corresponding to the frequency modulation of the injected carrier signal so that an audio frequency or intelligence signal is obtained directly without the aid of a conventional detector of any kind. Any spurious amplitude modulation that may be present in the original signal, however, does not appear as interference, distortion or noise in the output. The synchronized oscillator, therefore, performs simultaneously as an amplitude limiter and a frequency modulation detector or discriminator.

Various other objects and advantages of the invention will become apparent from a perusal of the following specification and the drawings accompanying the same.

Figure 1:
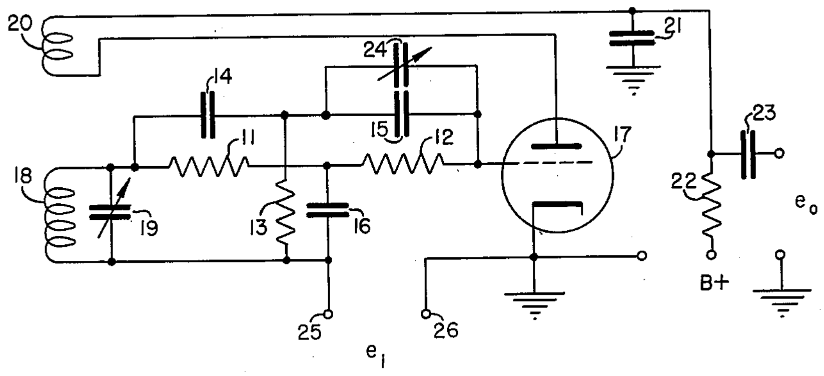
Fig. 1 is a circuit diagram of one embodiment of the invention in which a T-bridge network is used in the input or grid circuit of the oscillator.

Referring to the drawings in detail, and first to Fig. 1, this shows a preferred embodiment of the invention in which a T-bridge phase-shifting network consisting of resistors 11, 12 and 13, and capacitors 14, 15 and 16, is placed in the grid circuit of a triode oscillator 17. The right hand end of the T of the network is connected to the grid at the junction of capacitor 15 and resistor 12 while the left hand end of the T, at the junction of the capacitor 14 and resistor 11, is connected to the upper end of a tuned circuit consisting of the inductance 18 and capacitance 19 in parallel connection. The bottom end of the T, at the junction of resistor 13 and capacitor 16, forms one input terminal 25, the other input terminal 26 being connected to the grounded cathode. The frequency modulated synchronizing voltage $e_1$ is applied to these terminals.

Feedback is furnished by the electromagnetic coupling between the inductance 20 in the plate circuit of the tirode and the inductance of the parallel-tuned circuit. One end of the inductance 20 is connected directly to the plate of the triode and the other end through a load resistance 22 to the positive side, B+, of a suitable plate voltage source not shown and which may be of any known or other suitable form grounded at its negative terminal. A bypass capacitor 21 provides a high frequency shunt around the load resistance 22 and plate voltage source. Output voltage is taken across resistor 22 and ground, through capacitor 23. This combination of resistor 22 and capacitor 23 forms an audio output circuit.

Capacitor 19 is made variable to enable the tank circuit to be tuned to a frequency near the upper limit of carrier wave swing. In order to trim the T-bridge for a good null, provision may be made for varying the value of one of the capacitors 14, 15 or 16. To this end a small capacitor 24 may be connected in multiple with one of those already present.

Figure 2:
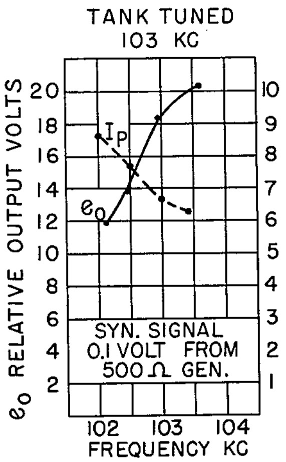
Fig. 2 is a graph of one type of characteristic of a circuit embodying the principle of the present invention.

Fig. 2 shows the type of characteristic achieved in the embodiment of Fig. 1, with a peak value of injected voltage of about 0.1. It will be apparent from this characteristic that a very small amount of frequency modulation about a given mean or center carrier frequency can be detected with this circuit. In general, the output $e_0$ increases up to the point at which the tank circuit resonance frequency becomes that corresponding to a peak at the top of the linear range of the characteristic. In other words when the tank circuit resonant frequency is such that the output voltage of the oscillator will be at its maximum in the linear range when the carrier frequency is at its maximum. By using a high L—C ratio in the tank a still higher sensitivity may be achieved, for a given type of tube.

In a practical embodiment of the circuit of Fig. 1, the constants were as follows:

| | |
|---|---|
| Resistance 11 | 33K |
| Resistance 12 | 33K |
| Resistance 13 | 15K |
| Condenser 14 | 50 mmf. |
| Condenser 15 | 50 mmf. |
| Condenser 16 | 100 mmf. |
| Tube 17 | 6J5 |
| Coil 18 | 10 mh. |
| Condenser 19 | 500 mmf. |
| Coil 20 | 16 mh. |
| Condenser 21 | 0.1 mf. |
| Resistance 22 | 470K |
| Condenser 23 | To pass desired audio band. |
| Condenser 24 | 30 mmf. |
| Source B+ | 175 v. |
| T-bridge null at | 75 kc. |
| Tank circuit | 103 kc. |
| FM signal approx. | 102–103 kc. |

Figure 3:
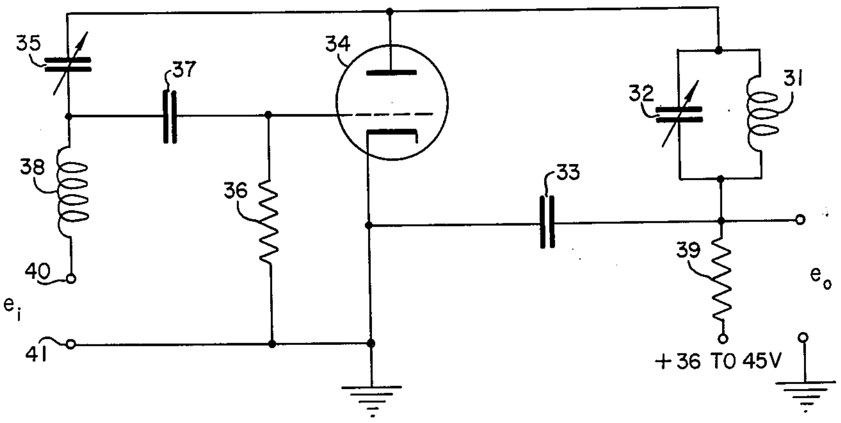
Fig. 3 is a circuit diagram of a second embodiment of the invention.
Figure 4:
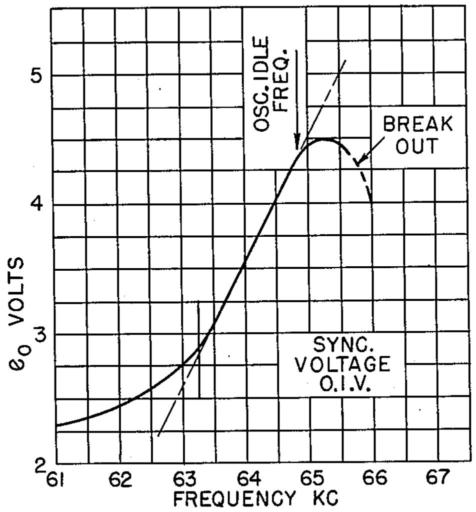
Fig. 4 is a graph of the characteristic of the oscillator circuit of Fig. 3.

In the embodiment diagrammed in Fig. 3, an electron tube, having an anode or plate, cathode and grid, has in its plate circuit a parallel tuned circuit consisting of an inductance 31 and condenser 32, connected in series with a load resistance 39 and the positive terminal of a source of plate voltage +35—45 v., it being understood that such source has its negative terminal connected to a common ground with the cathode. A bypass condenser 33 connects the cathode to the junction between the tuned circuit and the load resistance 39. The grid coil 38 has its upper terminal connected through a grid condenser 37 to the grid while a grid resistance 36 connects the grid to the cathode. A variable feed-back condenser 35 connects the plate to the upper terminal of the grid coil. This feedback condenser and the grid coil constitute a phase-shift network. Interposed between the lower terminal of the grid coil and the cathode are a pair of input terminals 40—41 between which the signal voltage is introduced. Output voltage is taken from the junction of the resistance 39 and the parallel tuned circuit, to ground. The characteristic of this circuit is shown in Fig. 4.

In a practical embodiment of the circuit of Fig. 3, the constants were as follows:

| | |
|---|---|
| Inductance 31 | 16 mh. |
| Condenser 32 | 500 mmf. |
| Condenser 33 | 0.1 mf. |
| Condenser 35 | 500 mmf. |
| Resistance 36 | 33K |
| Condenser 37 | 0.00125 mf. |
| Inductance 38 | 10 mh. |
| Resistance 39 | 100K |
| $e_{bb}$ | 45 v. |
| $e_1$ | 0.1 v. |

For this embodiment, with the above values of circuit constants, the output voltage is proportional to the plate current. The natural frequency of the oscillator is as indicated near the upper end of the operating band-width. This is a general condition for better operation of these circuits.

In either of the embodiments here shown, the impedance and type of coupling of the source of synchronizing voltage may affect the oscillator characteristic. For example, if electromagnetic coupling between an intermediate frequency tank circuit and an input tank circuit of the oscillator is utilized, the oscillator frequency may be changed and its characteristic changed accordingly. To avoid this the impedance and coupling must be chosen carefully so that the variation in characteristic is acceptable. Also a proper feedback method, such as insertion of a neutralizing capacitance may be used.

Figure 5:
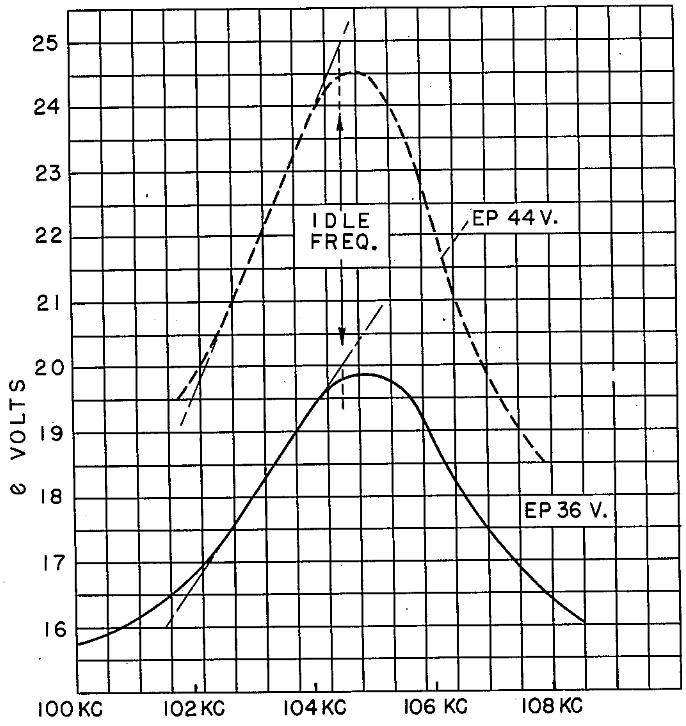
Fig. 5 is a graph of the characteristics of the oscillator circuit of Fig. 3 for different plate voltages.

Fig. 5 shows characteristics at different plate voltages of the embodiment of Fig. 3, having substantially the same circuit constants but using a sub-miniature tube of the type known as hearing-aid tube, with the oscillator tuned to an idle frequency near 104 kc. for reception of a carrier frequency modulated between 102 and 103 kc. This arrangement has been found useful in a portable underwater receiver to be carried by a swimmer for reception of underwater compressional waves.

It was found that in general, the lower the plate voltage the wider the tracking of the oscillator. The output voltage increases with the resistance of the grid leak up to the point of instability.

Figure 6:
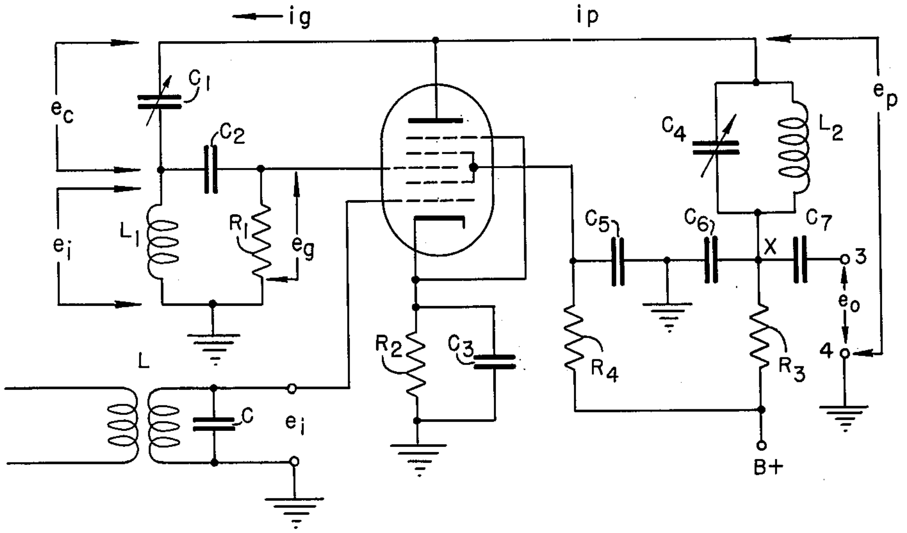
Fig. 6 is a circuit diagram of a third embodiment of the invention.

To take care of signal injection on a separate grid the modification diagrammed in Fig. 6 is provided. It is to be noted that this embodiment uses the same phase shift network as Fig. 3 which was found to be the better of the two phase shifting systems and makes use of a pentagrid-converter-type tube. Almost any of the conventional converter tubes could be used. It will also be noted that the signal injection circuit is completely isolated so that the coupling influence previously mentioned is greatly reduced. The signal resonant circuit L—C can be a standard I.F. transformer if the discriminator is used in a superheterodyne; or it can be an R.F. transformer if the discriminator is operated at the input carrier signal frequency in a tuned-radio-frequency receiver—in which case the coil L may be connected to a preceding R.F. amplifier or even directly to the antenna.

A theory of operation of the circuit of Fig. 6 is as follows:

The frequency modulated input signal $e_1$ is applied to the first grid of a 6L7 type tube from the tuned output circuit of the coupling L—$L_2$. The cathode resistor $R_2$, suitably bypassed for both audio and radio frequencies by condenser $C_3$, maintains the cathode sufficiently positive to prevent the first grid's drawing current for reasonable input levels. The impedance of this input grid, therefore, is high and will not load at any tuning or resonant circuit which may be used in the injection signal circuit.

Grids 2 and 4 of the tube comprise a screen or shield grid. Suitable D.C. potential is applied to these through dropping resistor $R_4$ which is connected to the B-supply Bypass condenser $C_5$ is sufficiently large to be of a low reactance to audio as well as radio frequencies.

In the tube plate circuit is a resonant tank composed of inductance $L_2$ and variable capacity $C_4$, and an audio frequency load resistor $R_3$. Bypass condenser $C_6$ shunts R.F. currents to ground but this capacity should not be great enough to allow appreciable audio frequency current flow. Audio frequency output voltage $e_0$ which is developed across load resistor $R_3$ is fed to an external load at terminals 3—4 through coupling condenser $C_7$.

Shunted from tube plate to ground is a phase-shifting network composed of inductance $L_1$ and capacitor $C_1$. From the common point between $L_1$ and $C_1$ a coupling condenser $C_2$ is attached to the third grid of the tube. Capacitor $C_2$ need be only large enough to have negligible reactance at the radio frequency being received. A grid leak resistor $R_1$ is connected from the third grid of the tube to ground so that rectified grid current which flows to ground will develop sufficient grid bias for proper operation when the circuit is oscillating. The higher this grid leak $R_1$, the greater the audio output voltage from the discriminator. Too great a grid leak value must not be used, however, else the circuit break into intermittent oscillation. Typical grid leak values may be from ½ to 10 megohms.

Now let us suppose the input signal $e_1$ has a mean frequency of 10 mc. and it is being frequency modulated with a maximum deviation of 75 kc. In this case the plate tank circuit $L_2$—$C_4$ should be tuned to approximately 10.080 mc.—just slightly higher than 10 mc. plus 75 kc. or 10.075 mc.

The phase shift circuit $L_1$—$C_1$ (which is really a series resonant circuit) then should be tuned slightly higher in frequency than the plate tank $L_2$—$C_4$. A suitable frequency for the grid phase shift circuit might be 10.085 mc. In any case, for proper operation, it is always essential that the grid phase network be tuned even higher in frequency than the plate circuit. In this way the grid circuit will be capacitive in nature and give the proper phase shift for desirable operation.

If we assume for a moment that the injected signal $e_1$ is zero, the oscillator will oscillate at its own natural frequency of 10.080 mc. That it will oscillate under proper conditions can be illustrated by referring to Fig. 7. Here we have the vector $e_p$ representing the plate voltage. Since the tank circuit $L_2$—$C_4$ is resonant, it will behave as a high-impedance resistive load. The plate circuit $i_p$, therefore, is small in value and in-phase with the plate voltage $e_p$. This is shown by the heavy vector in Fig. 7.

The grid phase network $L_1$—$C_1$, however, is resonant at a slightly higher frequency. This circuit, hence, is slightly capacitive, and the current $i_g$ flowing through it will lead the plate voltage $e_p$ by a small angle $\theta$. For this condition, the voltage $e_c$ developed across capacitor $C_1$ will lag behind $i_g$ by nearly 90° and the voltage $e_L$ developed across inductance $L_1$ will lead $i_g$ by nearly 90°. These vectors are indicated in the figure. The voltage $e_L$, of course, is applied to the tube grid as feedback voltage. Note that although $e_L$ is not exactly 180° out-of-phase with the plate voltage $e_p$, it does have a component $e_g$ which is so. With proper adjustment of the circuit in Fig. 6, this feedback voltage $e_g$ can be made sufficiently great to sustain continuous oscillation.

Now suppose an input signal $e_1$ be applied to the circuit. If this injected signal has the same frequency as that of the oscillator, then the conditions of Fig. 7 will prevail and the plate current $i_p$ will be as shown. If, however, the injected signal has a lower frequency than that of the oscillator, the oscillator will attempt to fall in step by lowering its own frequency. The oscillator will be able to synchronize itself and maintain continuous oscillation at this new low frequency only if the feedback voltage remains of sufficient amplitude and proper phase. The grid phase shift network of $L_1$—$C_1$ in Fig. 6 makes these conditions possible.

Figure 8:
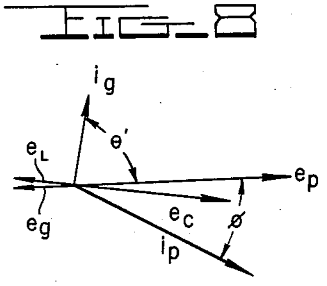
Fig. 8 is a vector diagram showing the operating condition at a frequency lower than the natural frequency of the oscillator.

At the new low frequency, the plate tank circuit $L_2$—$C_4$ will not be resonant; instead, it will be inductive and the absolute impedance will be considerably lower. We have then the condition shown in Fig. 8. The plate current $i_p$, considerably greater in magnitude, lags behind the plate voltage $e_p$ by the angle $\phi$. Since for this low frequency, the phase shift network $L_1$—$C_1$ will be even farther from resonance, it will appear highly capacitive. Feedback current $i_g$, hence, will be smaller and lag behind the plate voltage $e_p$ by the larger angle $\theta'$. For this condition, the condenser voltage $e_c$ which lags $i_g$ by 90° is quite large and inductance voltage $e_L$, leading $i_g$ by 90° is much smaller. The inductance voltage $e_L$, of course, is the grid feedback voltage. Note that although $e_L$ is smaller, its component $e_g$ which is exactly 180° out-of-phase with the plate voltage $e_p$ is very nearly the same as before. We find then that sufficient feedback is realized at this new low frequency to maintain continuous oscillation.

Although the plate tank circuit $L_2$—$C_4$ introduces phase shift when operated off-frequency, the grid network $L_1$—$C_1$ supplies enough phase shift in the opposite direction to keep the feedback voltage $e_g$ very nearly constant over a wide frequency range. The oscillator, therefore, will track frequency excursions of the injected signal with ease.

The oscillator will not follow the injected signal for frequencies higher than its own natural frequency because phase shifts in the grid phasing network result in negative rather than positive feedback and the oscillator either ceases functioning or breaks out of synchronization. For frequencies lower than its own natural frequency, however, the oscillator will follow as long as the feedback voltage $e_g$ has sufficient magnitude to maintain oscillation. It is only when the impedance of the plate tank circuit $L_2$—$C_4$ falls to such a low value that very little R.F. plate voltage can be developed across it and insufficient feedback current $i_g$ can be realized that the oscillator ceases tracking.

Figure 7:
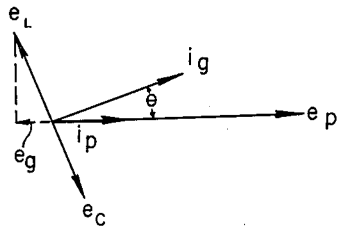
Fig. 7 is a vector diagram showing certain operating conditions of the circuit of Fig. 6 at oscillator frequency.

But note that when the oscillator is operated at or near its own natural frequency, the current $i_p$ is small as shown in Fig. 7. This means there will be little voltage drop across the load resistor $R_3$ in Fig. 6 and point X will have a relatively high potential. On the other hand, when the injected signal forces the oscillator to operate at a frequency lower than its natural one, the plate current $i_p$ is relatively high as pictured in Fig. 8. The voltage drop across load resistor $R_3$, therefore, will be high, and the potential of point X will fall.

It is obvious then that the potential of point X will vary as the frequency of the input signal $e_1$ is varied. If injection voltage $e_1$ is a frequency modulated R.F. signal, then the voltage at point X will be an audio frequency voltage $e_o$ corresponding to the degree and manner of modulation. This audio voltage $e_o$, of course, is fed through coupling capacitor $C_7$ to any output load such as headphones, speaker, or following audio amplifiers.

Is is apparent that the principal effect of the input signal $e_1$ is to bring the oscillator frequency into synchronization. In so doing, of course, the plate current drawn by the oscillator is changed and an audio output voltage is delivered. Within comparatively wide limits, the frequency of the input signal $e_1$ is its most important parameter. As long as it is sufficient to synchronize the oscillator, the magnitude of the input signal is relatively unimportant. This means that the oscillator-discriminator is relatively insensitive to amplitude changes in the input signal and performs very well as a limiter. It also means that a large magnitude frequency modulated signal and a small magnitude signal which is still sufficiently great to bring the oscillator into synchronization will result in the same audio frequency output voltage; the oscillator-limiter-discriminator, therefore, has an inherent automatic volume control characteristic.

Figure 9:
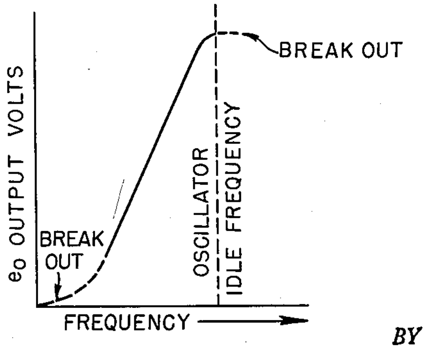
Fig. 9 is a graph showing potential at point X versus changes in input.

The manner in which the potential of point X follows changes in input signal frequency is about like the curves shown in Fig. 9.

An important feature of the frequency discriminator herein disclosed is its sensitivity to frequency modulated signals of small magnitude. A second feature is the ability of the synchronized oscillator to track the injected carrier signal over a very wide frequency swing. A third feature is that the oscillator is relatively insensitive to amplitude changes in the input signal. A fourth feature is that the oscillator gives approximately the same audio frequency output voltage for both large and small input signal amplitude, thus exhibiting an inherent automatic volume control characteristic.

While certain specific embodiments of the invention have been described herein for the sake of disclosure, it is to be understood that the invention is not limited to such specific embodiments but contemplates all modifications and variations thereof as fall fairly within the scope of the appended claims.

The invention described herein may be manufactured and used by or for the Government of the United States of America for governmental purposes without the payment of any royalties thereon or therefor.

What is claimed is:

1. A frequency modulation receiver system comprising a multigrid tube having two input grids, a cathode and an anode, a source of plate voltage having its negative terminal connected to a common ground, a cathode resistor connecting the cathode with the common ground, a bypass condenser connected in shunt of the resistor, a parallel-tuned circuit connected in the anode circuit of the tube in series with a load resistance and said source of plate voltage with the tuned circuit nearest the anode and the load resistance between the tuned circuit and the positive terminal of the said source, a bypass condenser connecting the junction between the tuned circuit and the load resistance to the common ground, a grid coil having one terminal connected through a grid condenser to one of said input grids and the other terminal connected to the common ground, a grid resistance connecting said one grid to the common ground, a variable feedback condenser connecting the anode with said one terminal of the grid coil, said feedback condenser and grid coil constituting a phase-shift network, a pair of signal input terminals, one connected to the other said input grid and the other to the common ground, and a pair of output terminals one connected through a blocking condenser to the junction of the load resistance with the tuned circuit and the other connected to ground.

2. A frequency modulation receiver system comprising a multigrid tube having two input grids, a cathode and an anode, a source of plate voltage having its negative terminal connected to a common ground, a cathode resistor connecting the cathode with the common ground, a bypass condenser connected in shunt of the resistor, a parallel-tuned circuit connected in the anode circuit of the tube in series with a load resistance and said source of plate voltage with the tuned circuit nearest the anode and the load resistance between the tuned circuit and the positive terminal of the said source, a bypass condenser connecting the junction between the tuned circuit and the load resistance to the common ground, a grid coil having one terminal connected through a grid condenser to one of said input grids and the other terminal connected to the common ground, a grid resistance connecting said one grid to the common ground, a variable feedback condenser connecting the anode with said one terminal of the grid coil, said feedback condenser and grid coil constituting a phase-shift network, a pair of signal input terminals, one connected to the other said input grid and the other to the common ground, a screen grid for the tube, a dropping resistor connected between the screen grid and the positive terminal of said plate voltage, a bypass condenser connecting the said screen grid to the common ground and a pair of output terminals one connected through a blocking condenser to the junction of the load resistance with the tuned circuit and the other connected to ground.

References Cited in the file of this patent

UNITED STATES PATENTS

| | | |
|---|---|---|
| 1,938,657 | Hansell | Dec. 12, 1933 |
| 1,950,406 | Hoorn | Mar. 13, 1934 |
| 2,216,829 | Plebanski | Oct. 8, 1940 |
| 2,406,082 | Lange | Aug. 20, 1946 |
| 2,440,073 | Bradley | Apr. 20, 1948 |
| 2,440,653 | Corrington | Apr. 27, 1948 |
| 2,494,795 | Bradley | Jan. 17, 1950 |